United States Patent [19]
Byun

[11] Patent Number: 5,645,887
[45] Date of Patent: Jul. 8, 1997

[54] METHOD FOR FORMING PLATINUM SILICIDE PLUGS

[75] Inventor: Jeong Soo Byun, Chungcheongbuk-do, Rep. of Korea

[73] Assignee: LG Semicon Co., Ltd., Chungcheongbuk-do, Rep. of Korea

[21] Appl. No.: 523,749

[22] Filed: Sep. 5, 1995

Related U.S. Application Data

[63] Continuation-in-part of Ser. No. 182,844, Jan. 14, 1994, abandoned.

[51] Int. Cl.$^6$ .................... C23C 16/00; H01L 21/28
[52] U.S. Cl. .................. 427/248.1; 427/96; 427/97; 427/125; 427/255; 427/255.7; 437/191; 437/192; 437/193; 437/200
[58] Field of Search ................. 427/96, 97, 125, 427/255, 255.7, 248.1; 437/191, 192, 193, 200

[56] References Cited

U.S. PATENT DOCUMENTS

| | | |
|---|---|---|
| 4,737,051 | 6/1989 | Farb et al. . |
| 4,818,723 | 4/1989 | Yen . |
| 4,966,868 | 10/1990 | Murali et al. . |
| 5,364,817 | 11/1994 | Lur et al. ............... 437/192 |
| 5,427,981 | 6/1995 | Choi ....................... 437/195 |

FOREIGN PATENT DOCUMENTS 5-160065  10/1993  Japan .

OTHER PUBLICATIONS

Paper entitled "A New Contact Plug Technique for Deep-Submicrometer ULSI's Employing Selective Nickel Silicidation of Polysilicon with a Titanium Nitride Stopper" by Tadashi Iijima, et al., published in IEEE Transactions on Electron Devices, vol. 40. No. 2, Feb., 1993.

*Primary Examiner*—Roy V. King
*Attorney, Agent, or Firm*—Morgan, Lewis and Bockius LLP

[57] ABSTRACT

A method for forming platinum silicide plugs suitable for use in very large scale integrated semiconductor devices having large aspect ratios. The method includes the steps of: providing a silicon substrate on which a conductive layer is formed; forming an insulating layer on the silicon substrate and the conductive layer; patterning the insulating layer to form a contact hole on the conductive layer; exposing the conductive layer to air to thereby form a thin native oxide layer on the conductive layer; forming a blanket polysilicon film on the entire resulting structure thick enough to completely fill the contact hole; etching back the blanket polysilicon film to expose the insulating layer, thereby forming a silicon plug in the contact hole; forming a platinum layer on the silicon plug and the insulating layer; performing heat treatment to thereby convert the silicon plug to a platinum silicide plug; and thereafter removing the remaining platinum layer.

14 Claims, 10 Drawing Sheets

METHOD FOR FORMING PLATINUM SILICIDE PLUGS

CROSS-REFERENCE TO RELATED APPLICATION

This is a continuation-in-part of application, Ser. No. 08/182,844, filed Jan. 14, 1994, now abandoned and whose entire contents are hereby incorporated by reference.

BACKGROUND OF THE INVENTION

The present invention relates generally to the production of semiconductor devices and, more particularly, to methods for forming silicide plugs suitable for use in very large scale integrated semiconductor devices having large aspect ratios.

As the dimension of semiconductor devices are reduced to below deep-submicron, the contact hole of the semiconductor device becomes smaller. Increasing the degree of integration of the semiconductor device increases the aspect ratio of the contact hole of the device. When the contact hole having such an increased aspect ratio is subjected to a conventional sputtering process or a physical vapor deposition process, a large scale concave area or void is formed. Formation of a plug in the contact hole is one of the important sputtering processes used in producing deep-submicron semiconductor devices.

Recently, the process for forming contact plugs for achieving a multi-layer wiring has been valued in accordance with the increase of the aspect ratio of the contact hole. Conventional processes for via plugs are classified as follows. First, a tungsten plug is formed in the contact hole by vapor deposition of a CVD tungsten layer in the contact hole. Second, a poly plug is formed in the contact hole by vapor deposition of a polysilicon in the contact hole. Third, a selective silicide plug is formed in the contact hole.

There are two methods for forming the tungsten plug in the contact hole. While a blanket CVD tungsten layer is used in one method, a selective CVD tungsten layer is used in the other method.

Description of the conventional methods with reference to the drawing is given below for better understanding of the background of this invention. Referring initially to FIGS. 1A through 1D, conventional contact plug formation processes using the blanket CVD tungsten layer are shown.

Figure 1A:
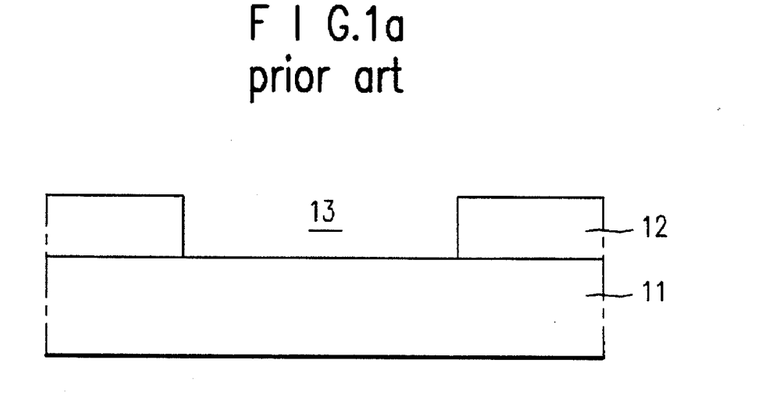
FIGS. 1A, 1B, 1C and 1D are schematic, cross-sectional views showing conventional processes for forming tungsten plugs using a blanket CVD tungsten film.
Figure 1B:
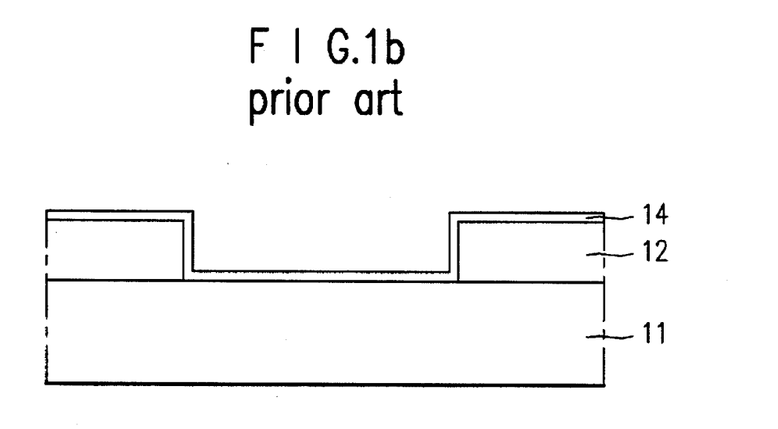
Figure 1C:
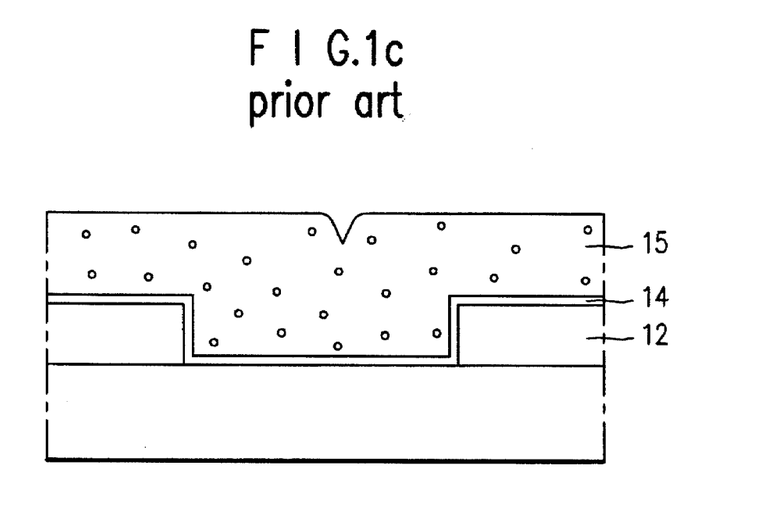
Figure 1D:
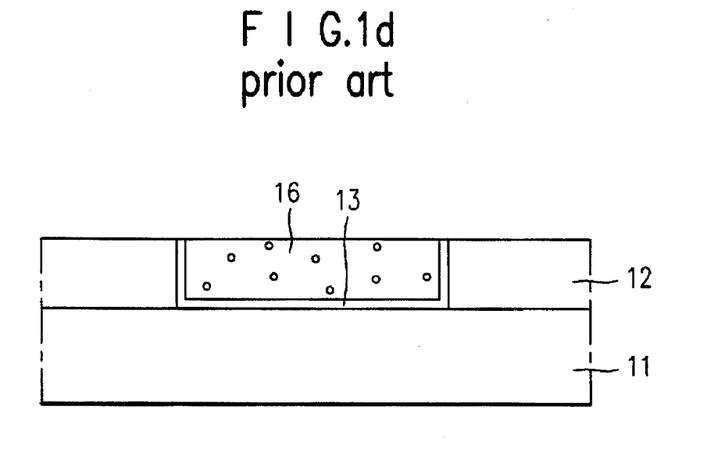

As shown FIG. 1A, on a starting material 11, such as a silicon substrate or a lower metal layer used in achieving a multi-layer wiring, an insulating film 12, such as an oxide film, is deposited and then subjected to a patterning process to form a contact hole 13. Next, as shown in FIG. 1B, an adhesive layer 14 selected from the group consisting of a Ti film, a TiW film, a TiN film and a Ti/TiN film is deposited on the entire resulting structure of FIG. 1A. Thereafter, as shown in FIG. 1C, a blanket CVD tungsten film 15 is deposited thick enough as to completely fill the contact hole 13. Finally, as shown in FIG. 1D, the blanket CVD tungsten film is subjected to an etch back process, so as to form a tungsten plug 16 in the contact hole 13.

Turning now to the method utilizing the selective CVD tungsten film to form the tungsten plug, the method comprises forming the contact hole as shown in FIG. 1A, to expose the starting material therethrough and selectively depositing a CVD tungsten film on the exposed starting material, to form a tungsten plug.

The blanket tungsten plug technology has disadvantages such as the occurrence of a void in the contact hole and the need for an adhesive layer due to the low adhesiveness. Also, the selective tungsten plug technology is disadvantageous in that special treatment is necessary for satisfying selective growth conditions since two contact holes having different depths are to be filled at the same time.

In order to form a poly plug in the contact hole, one of two methods, namely, a method using a blanket polysilicon film or a method using a selective polysilicon film, is used.

The method using the blanket polysilicon film to form the poly plug is similar to that using the blanket CVD tungsten film to form the tungsten plug as shown in FIG. 1. That is, the poly plug is formed by forming a contact hole on a starting material, depositing a polysilicon film doped with dopants on the entire surface consisting of the starting material and the contact hole, heat treating the polysilicon film and applying an etch back process to the treated polysilicon film.

This blanket poly plug technology can completely solve the problems generated in the technology for forming the blanket tungsten plug. For example, the blanket poly plug technology provides good coverage and conformity when depositing the polysilicon film and thus, is one of the most useful technologies in mass production. Nevertheless, the technology has the disadvantage that the poly plug formed has a large contact resistance.

Among the conventional processes for forming via plugs, a selective silicide plug is formed using either a selective epitaxy layer or a poly plug.

Referring now to FIGS. 2A through 2D, conventional silicide plug formation processes using the selective epitaxy layer are shown.

Figure 2A:
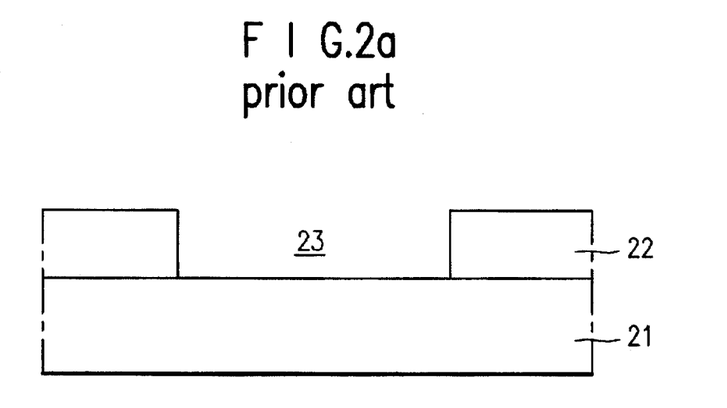
FIGS. 2A, 2B, 2C and 2D are schematic, cross-sectional views showing conventional processes for forming silicide plugs using a selective epitaxy layer.
Figure 2B:
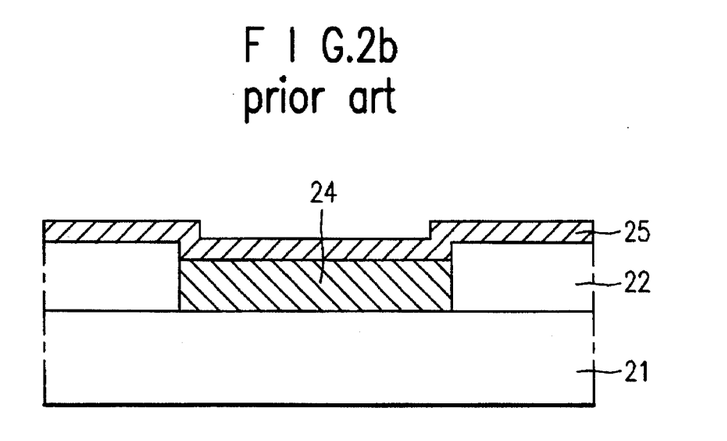
Figure 2C:
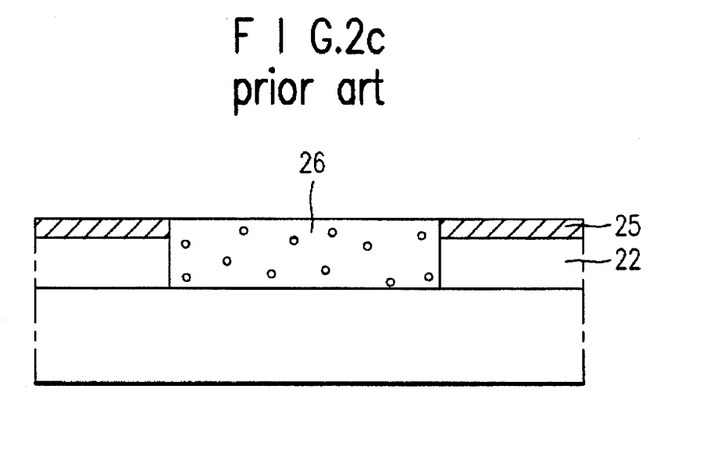
Figure 2D:
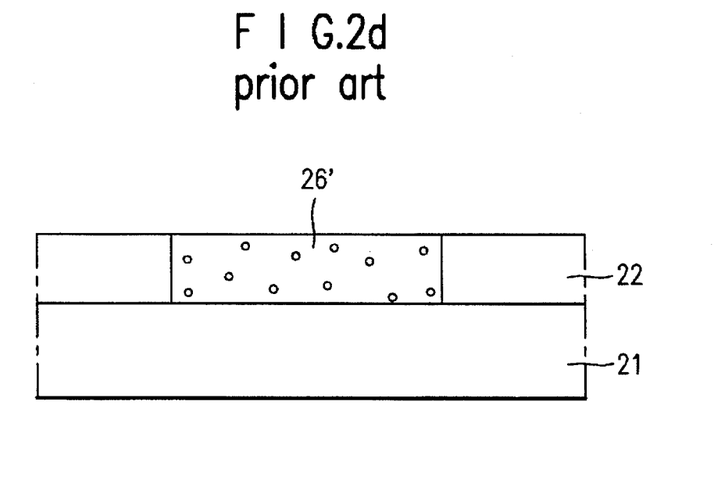

As shown in FIG. 2A, on a starting material 21, such as a silicon substrate or a lower metallic layer used in forming a multi-layer wiring, an insulating film 22, such as an oxide film, is deposited and is then subjected to a patterning process to form a contact hole 23. Next, a selective epitaxy layer 24 is grown in the contact hole 23 until it fills half of the contact hole 23 and then, a metal film 25, such as a cobalt film and a titanium film, is deposited on the entire resulting structure of FIG. 2A, as shown in FIG. 2B. Thereafter, a heat treatment is applied to the metal film 25, so as to form a silicide film 26, as shown in FIG. 2C. Finally, non-reacted metal film pieces are removed with an acid solution, so as to form a silicide plug 26' in the contact hole 23.

A silicide plug formation method using a poly plug has been well reported in IEEE Trans, Electron Devices 40.371, 1993. With reference to FIGS. 3A through 3H, conventional silicide plug formation processes using the poly plug are shown.

Figure 3A:
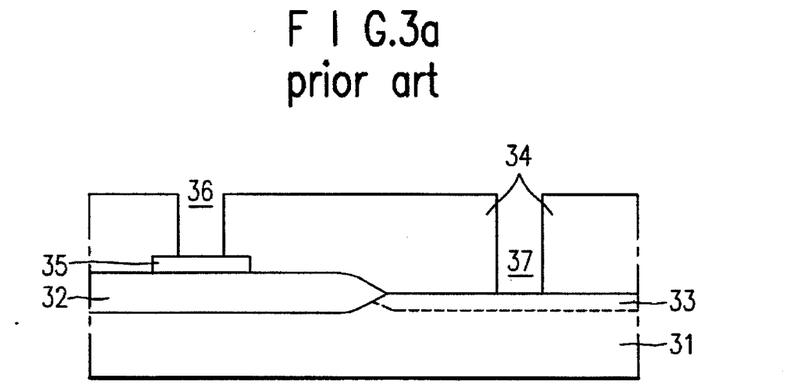
FIGS. 3A, 3B, 3C, 3D, 3E, 3F, 3G and 3H are schematic, cross-sectional views showing conventional processes for forming silicide plugs using a polysilicon plug.

As shown in FIG. 3A, a field oxidation process is carried out on a silicon substrate 31 to form a field oxide film 32 thereon, and n-type impurities are implanted in the silicon substrate 31 to form an $n^+$ type impurity region 33. Thereafter, a polysilicon film 35 is deposited on the entire resulting structure and then subjected to a patterning process so that polysilicon film 35 remains only on the field oxide film 32. An insulating film 34 is coated on the entire resulting structure and subsequently subjected to a patterning process, so as to form two contact holes 36 and 37, with the contact hole 36 on the polysilicon film 35 and the contact hole 37 on the predetermined portion of the $n^+$ type impurity region 33, respectively. At this time, the two contact holes have different depths.

Figure 3B:
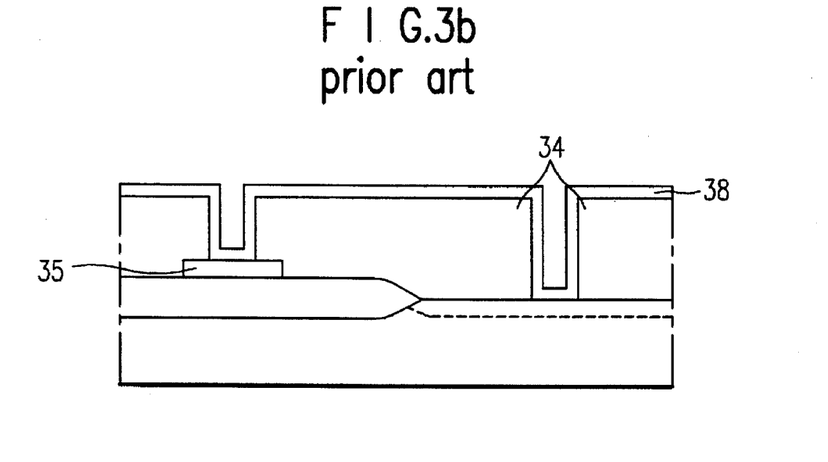

On the entire resulting structure of FIG. 3A, as shown in FIG. 3B, there is deposited a composite film 38 consisting of TiN and Ti having thicknesses of seventy nm and sixty rim, respectively. The TiN/Ti film 38 is heat treated at 600° C.

under nitrogen ambient. The resulting TiN/Ti film functions as an adhesive layer and a silicidation stopper.

Figure 3C:
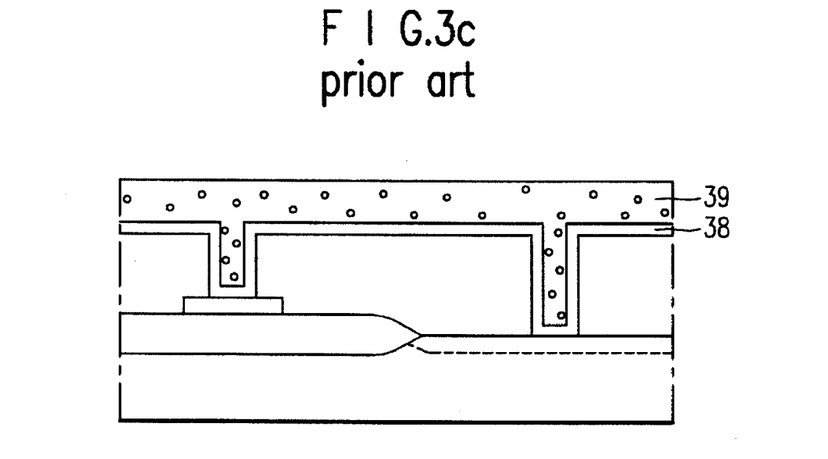
Figure 3D:
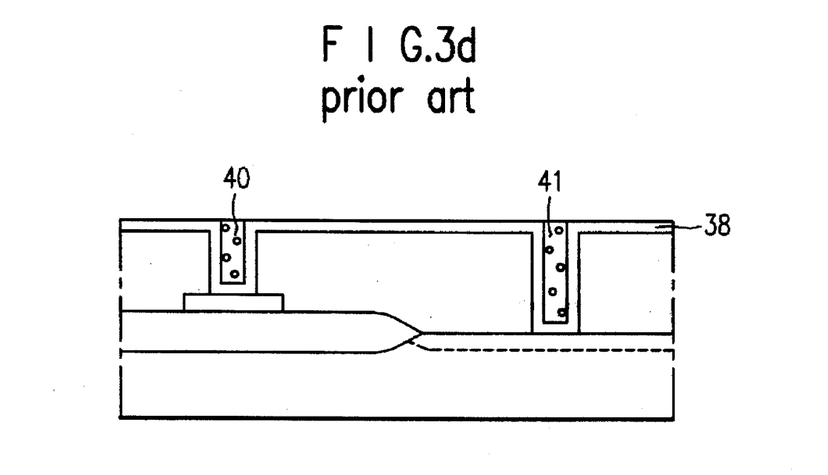

As shown in FIG. 3C, a polysilicon film 39 without dopants is deposited on the entire resulting structure with a thickness of about one μm with a low pressure CVD (hereinafter, "LPCVD") process, so as to completely fill the contact holes 36 and 37. Subsequently, an etch back process is applied to the polysilicon film 39 to expose the TiN/Ti film 38, leaving the polysilicon film 39 only in the contact holes 36 and 37, as shown in FIG. 3D. As a result, poly plugs 40 and 41 are formed in the contact holes 36 and 37, respectively. During the formation of the plugs, the TiN/Ti film 38 is not removed.

Figure 3E:
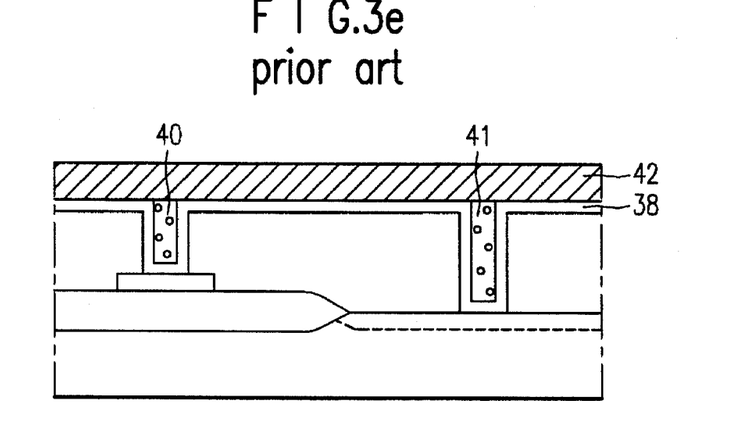
Figure 3F:
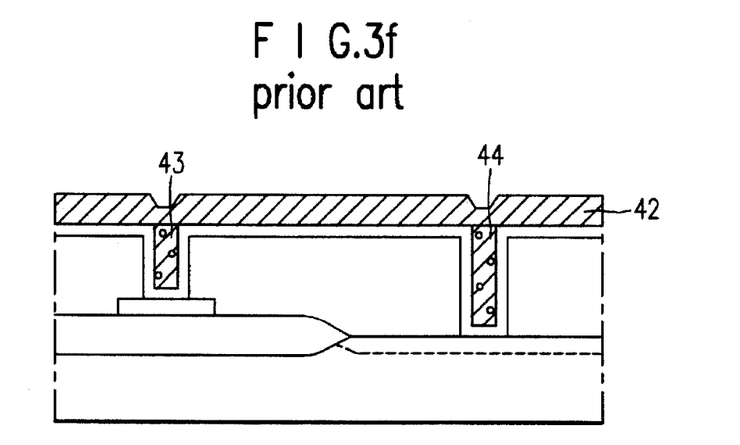
Figure 3G:
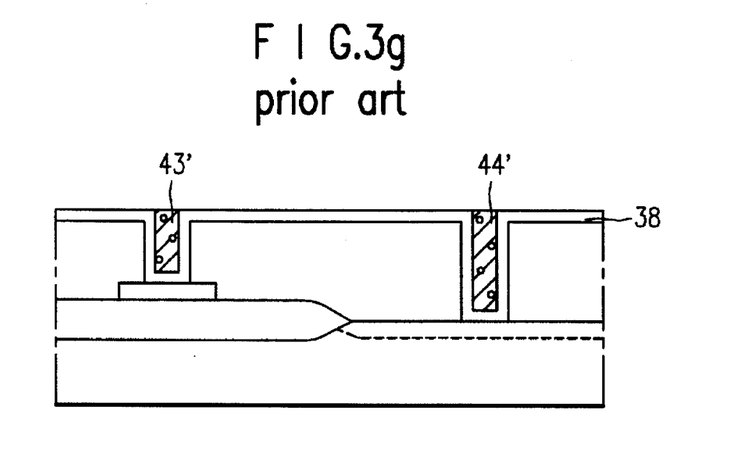
Figure 3H:
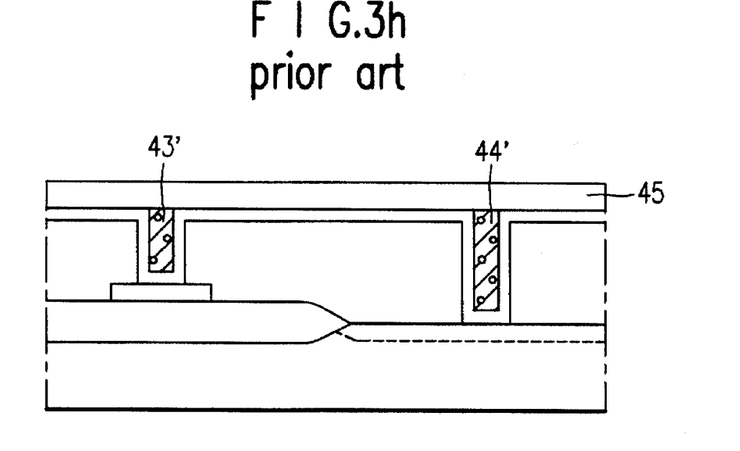

A nickel film 42 is then deposited on the entire resulting structure with a thickness of 500 nm using a sputtering process, as shown in FIG. 3E. A heat treatment is applied to the resulting structure of FIG. 3E at 600° C. under an argon ambient, transforming the poly plugs 40 and 41 to nickel silicides ($Ni_3Si$) 43 and 44, respectively, as shown in FIG. 3F. Non-reacted nickel film 42 is selectively removed with 70% $HNO_3$ solution, so as to form silicide plugs 43' and 44' in the contact holes 36 and 37, as shown in FIG. 3G. Finally, a metal wiring film (Al-Si-$CuD_5$) 45 is formed on the entire resulting structure.

Since the TiN/Ti film 38 functions as a silicide stopper as mentioned above, two silicide plugs can be simultaneously formed in the two contact holes having different depths, respectively.

The physical properties of the metals required to form the silicide plug are as follows: since the formation processes for the plug are carried out after the formation of the source/drain region or the first layer wiring, first, the temperature of formation for metal silicide formation is to be low; second, metal atoms have to move when forming the silicide plug; third, the silicide plug is to be stable; and the specific resistance of the silicide plug is to be low.

1. Temperature for silicide

Since the silicide plug is utilized in the contact holes of multi-wiring structures as well as in the source/drain junction, it is preferable that the formation temperature of the silicide is low, considering that the eutectic temperature of Al-Si film of final metal wiring is 577° C.

The temperatures of formation for major silicides are given in Table 1. According to Table 1, the temperature of formation for $Ni_3Si$ is 450° C., whereas that for PtSi is 300° C. Accordingly, the formation process for an $Ni_3Si$ plug must be carried out at a temperature that is 100° C. higher than that for a PtSi plug.

Considering that a device can be stabilized in low temperature process, $CoSi_2$ and $TiSi_2$, whose temperatures of formation are 550° C. and 600° C., respectively, are excluded, because the temperatures are somewhat lower or higher than that of metal wiring layer Al-Cu, 570° C.

TABLE 1

| Silicide | Temp. of Formation (°C.) | Eutectic Temperature (°C.) | Mobile Atom |
|---|---|---|---|
| Pt-Silicide | | | |
| $Pt_2Si$ | 200–500 | 1,100 | Pt |
| PtSi | 300 | 1,230 | Pt |
| Ni-Silicide | | | |
| $Ni_2Si$ | 200–350 | 1,318 | Ni |
| NiSi | 350–750 | 992 | Ni |
| $NiSi_2$ | ≦750 | 1,100 | |
| $Ni_5Si_2$ | 400 | 1,282 | |
| $Ni_3Si$ | 450 | 1,165 | |
| Co-Silicide | | | |
| $Co_2Si$ | 350–500 | 1,332 | Co |
| CoSi | 375–500 | 1,460 | Si |
| $CoSi_2$ | 550 | 1,362 | Co |
| Ti-Silicide | | | |
| TiSi | 500 | 1,920 | Si |
| $TiSi_2$ | 600 | 1,540 | Si |

Exemplary refractory metals are Ti, W and Ta, whereas near-noble metals include Co, Ni and Pt.

Figure 4A:
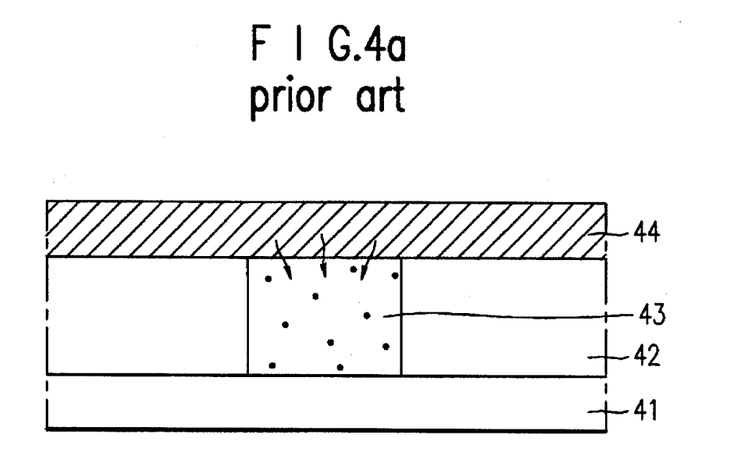
FIGS. 4A and 4B are schematic, cross-sectional views showing the conventional change of the silicide plug's shape, according to the motion of the metal atoms.
Figure 4B:
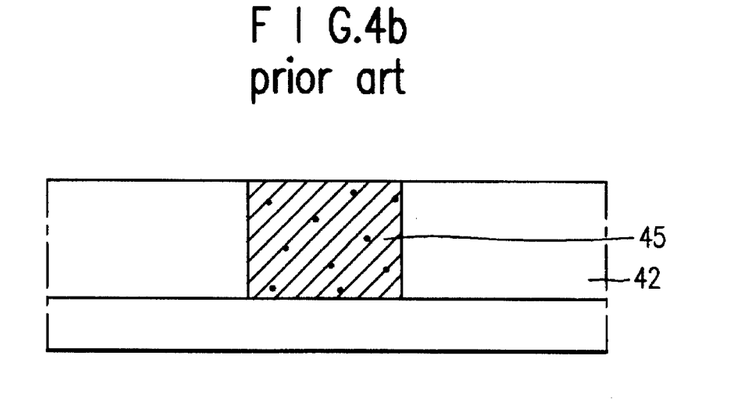
Figure 5A:
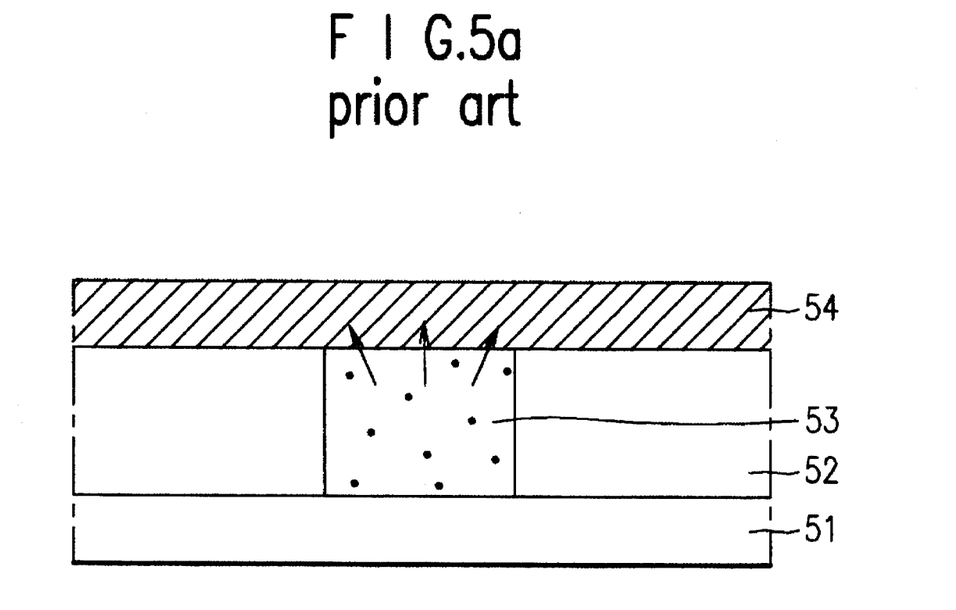
FIGS. 5A and 5B are schematic, cross-sectional views showing the conventional change of the silicide plug's shape, according to the motion of silicon atoms.
Figure 5B:
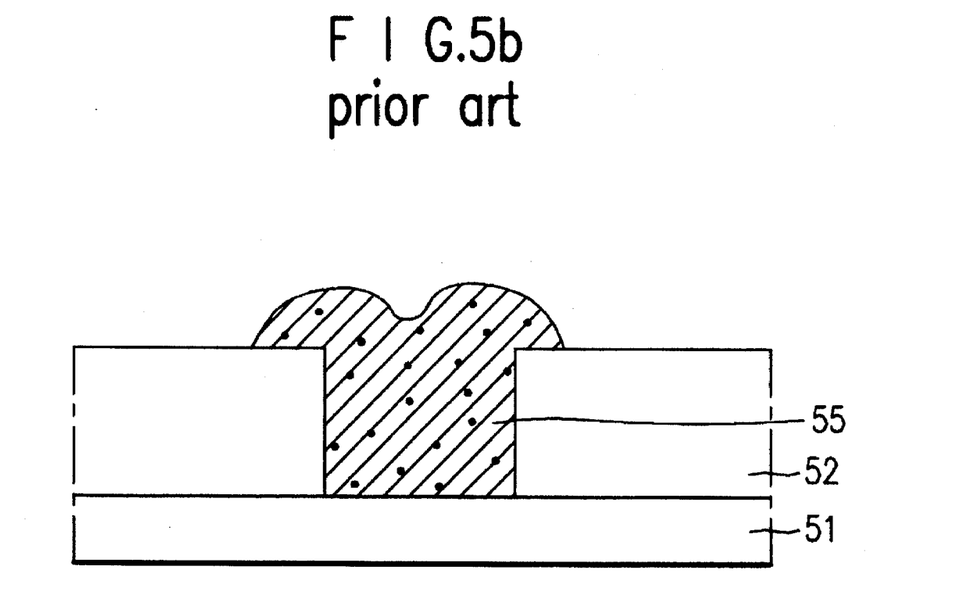

With reference to FIGS. 4 and 5, the shapes of the plugs according to the mobile atoms when forming the silicides are shown.

When a near-noble metal such as Co, Ni and Pt is used, as shown in FIGS. 5A and 5B, silicon atoms move. That is, silicon atoms move from a poly plug 53 to a metal layer, so that the silicide plug is formed not only in a contact hole but also around the contact hole. Therefore, in spite of the formation of an insulating film 52, the formation of the silicate around the contact hole causes problems such as electric short circuit, thereby lowering the characteristics of the device.

When using a refractory metal such as Ti, W and Ta, as shown in FIGS. 4A and 4B, metal atoms move from a metal layer 44 to the poly plug 43, so as to form a silicide plug only in the contact hole. Accordingly, a refractory metal which generates mobile atoms is more suitable to the formation of the silicide plug.

2. Electrical properties of silicides

As the specific resistance of a material for silicide plug is lower, the area resistance of the junction becomes lower, so the parasitic resistance is reduced. The specific resistances of major silicides are compared and given Table 2. As is apparent therefrom, the specific resistance of $Ni_3Si$ is twice as large as that of PtSi. Accordingly, the electrical characteristics of the $Ni_3Si$ plug are inferior to those of the PtSi plug.

TABLE 2

Comparison of the specific resistances of major silicides

| Silicide | Specific Resistance ($10^{-6}$ Ω · cm) |
|---|---|
| Pt-Silicide | |
| $Pt_2Si$ | |
| PtSi | 28–40 |
| Ni-Silicide | |
| $Ni_2Si$ | 20–25 |
| NiSi | 14–50 |
| $NiSi_2$ | 34–60 |
| $Ni_5Si_2$ | 149.5 |
| $Ni_3Si$ | 82 |
| Co-Silicide | |
| $Co_2Si$ | 60–130 |
| CoSi | 90–170 |
| $CoSi_2$ | 18–25 |
| Ti-Silicide | |
| TiSi | 63 ± 6 |
| $TiSi_2$ | 10–25 |
| B-doped poly-Si | >1,000 |
| CVD-W | ~10 |

3. Energy of formation for metal oxides

The energy of formation for metal oxide is an important variable showing the stability of the heat treatment process which is carried out to form silicides. The energies of formation for silicides and their metal oxides are shown below in Table 3.

For example, the energy of formation for titanium oxide (absolute value) is the largest, as compared with Pt, Ni or Co in Table 3. This means an impurity such as oxygen present in an ambient gas for the heat treatment has influence since it reacts with titanium but reacts very little with metals of small formation energy for oxides, such as Ni and Pt. Especially with Pt, oxygen atoms gather between PtSi and non-reacted Pt, so that it is inherent characteristic to efficiently control the reaction of formation for silicide. Consequently, PtSi is less sensitive W an ambient for the heat treatment than Ni, so that the processability and the productivity of the former are superior.

TABLE 3

Standard heat of formation for major silicides and their metal oxides.

| Metal element | Silicide | Silicide ΔH° F.* | Oxide | Oxide ΔH° F. |
|---|---|---|---|---|
| Pt | $Pt_2Si$ | −6.09~17.0 | PtO | −8.5 |
|    | PtSi | −7.9~20.1 | $Pt_3O_4$ | −5.6 |
|    |      |           | $PtO_2$ | −10.7 |
| Ni | $Ni_2Si$ | −10.5~−11.8 | NiO | −29.2 |
|    | NiSi | −10.2 | $Ni_2O_3$ | −23.4 |
|    | $NiSi_2$ | −6.9 | | |
|    | $Ni_5Si_2$ | −10.3 | | |
|    | $Ni_3Si$ | −8.9 | | |
| Co | $Co_2Si$ | −9.2 | CoO | −28.6 |
|    | CoSi | −12.0 | $Co_3O_4$ | −30.0 |
|    | $CoSi_2$ | −8.2 | | |
| Ti | TiSi | −15.2 | TiO | −67.5 |
|    | $TiSi_2$ | −10.7 | $Ti_2O_3$ | −75.0 |
|    |      |       | $Ti_3O_5$ | −73.4 |
|    |      |       | $TiO_2$ | −73.0 |

*kcal/g · atom

SUMMARY OF THE INVENTION

Therefore, an object of the present invention is to solve the above problem encountered in the prior art and to provide a method for forming silicide plugs suitable for use in very large scale integrated semiconductor devices having large aspect ratios.

In accordance with the present invention, the above object can be accomplished by providing a method for forming a silicide plug, comprising the steps of: patterning an insulating film deposited on a silicon substrate, so as to form a contact hole; depositing a blanket silicon film on the entire resulting structure thick enough so as to completely fill the contact hole; subjecting the blanket silicon film to etch back, so as to form a silicon plug; depositing a thin platinum film on the entire resulting structure; carrying out a heat treatment process, so as to form platinum silicide plug in the contact hole; and removing the non-reacted platinum film so as to form a silicide plug in the contact hole.

According to another definition of this invention disclosed herein is a method for forming a silicide plug, which includes the steps of: a) providing a silicon substrate on which a conductive layer is formed; b) forming an insulating layer on the silicon substrate and the conductive layer; c) patterning the insulating layer to form a contact hole on the conductive layer; d) exposing the conductive; layer to air to form a thin (under 70 Å thick) native oxide layer at the surface of the conductive layer; e) forming a blanket polysilicon film on the entire resulting structure thick enough as to completely fill the contact holes; f) etching back the blanket polysilicon film to expose the surface of the insulating layer, thereby forming a silicon plug in the contact hole; g) forming a platinum layer on the silicon plug and the insulating layer; h) performing heat treatment to convert the silicon plug to a platinum silicide plug; and i) removing the remaining platinum layer.

The above and other objects and advantages of the present invention will become more apparent as the following description proceeds. To accomplish the foregoing and related ends, the invention, then, comprises the features hereinafter fully described in the specification and particularly pointed out in claims, the following description and the annexed drawing setting forth in detail certain illustrative embodiments of the invention, this being indicative, however, of but some of the various ways in which the principles of the invention may be employed.

DETAILED DESCRIPTION OF THE PREFERRED EMBODIMENTS

Hereinafter, the preferred embodiments of the present invention will now be described in detail with reference to the accompanying drawings, wherein like reference numerals designate like parts.

Referring to FIGS. 6A through 6G, processes for forming silicide plugs using silicon plugs according to the present invention are illustrated.

Figure 6A:
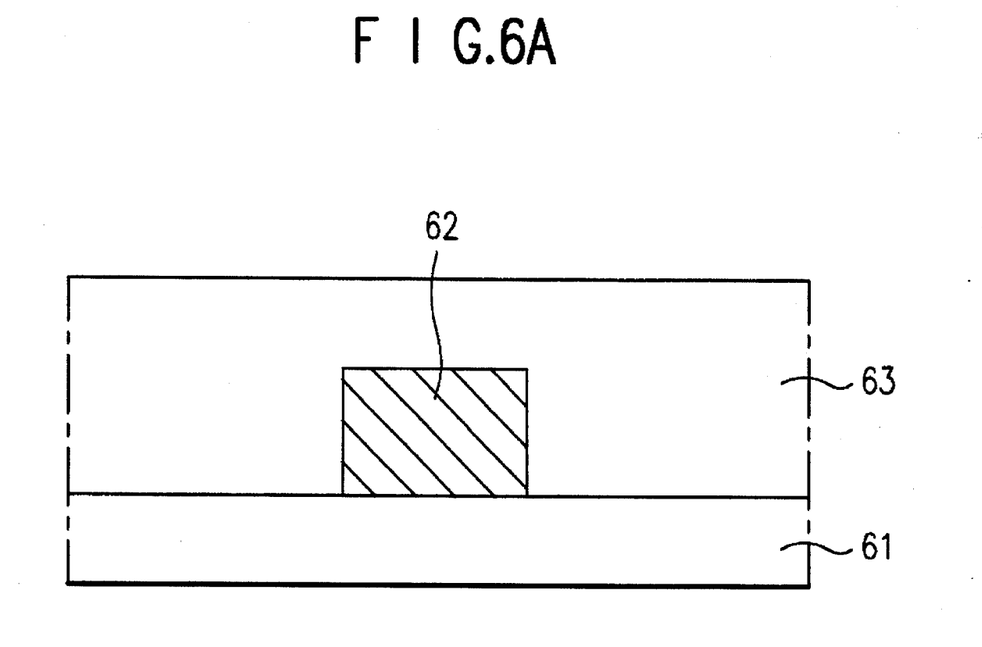
FIGS. 6A, 6B, 6C, 6D, 6E, 6F and 6G are schematic, cross-sectional views showing processes for forming silicide plugs using a silicon plug, in accordance with the present invention.
Figure 6B:
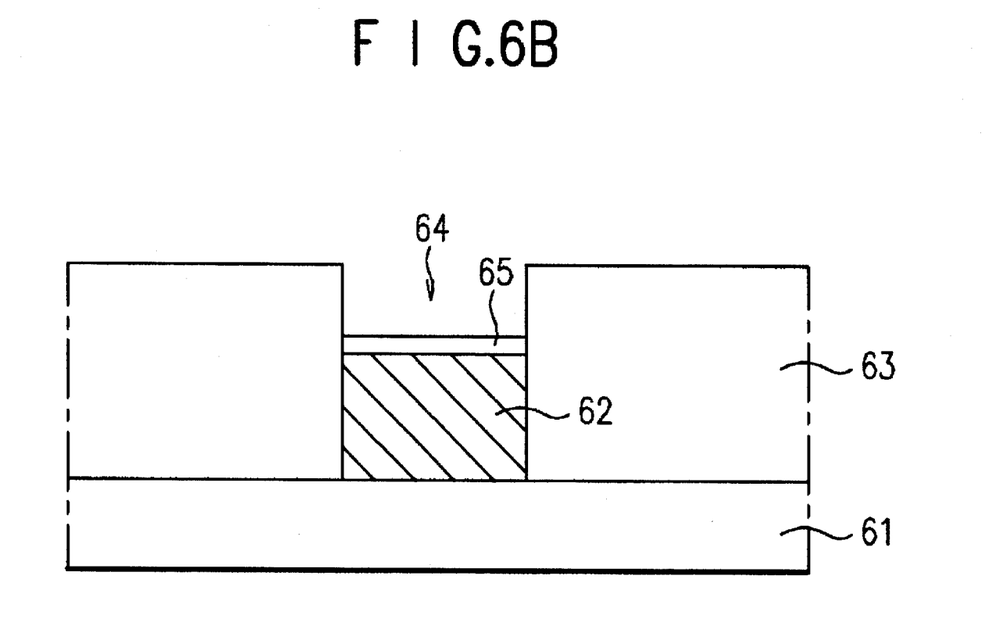

On a silicon substrate 61 on which a conductive layer 62 is formed as shown in FIG. 6A, an insulating film 63, such as an oxide film, is deposited on the substrate 61 and the conductive layer 62. As shown in FIG. 6B, the insulating film 63 is then subjected to a patterning process to form a contact hole 64 on the conductive layer 62. The contact hole 64 may be formed on a source/drain region of shallow junction in which a self-aligned silicide (hereinafter "SALICIDE") is formed, on a gate having a polycide or on refractory silicide such as tungsten silicide ($WSi_2$). When a multi-metal wiring such as $MoSi_2/Al-Si-Cu/MoSi_2$ is constructed, the contact hole 64 may be also formed on a refractory capped Al wiring formed on $MoSi_2$.

Figure 6C:
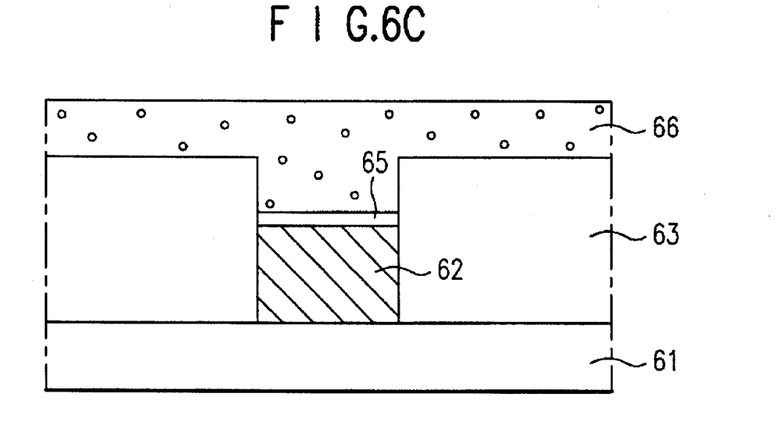

As shown in FIG. 6B, the contact hole 64 is exposed to air to form a native oxide layer 65 on the surface of this conductive layer 62. As shown in FIG. 6C, a blanket polysilicon film 66 is formed on the entire resulting structure at above 600° C. by an LPCVD process, thick enough as to completely fill the contact hole 64. At this time, an amorphous silicon film may be deposited at 500° C. in lieu of the polysilicon film 66. Herein, the thickness of the native oxide film 65 is determined to be under 70Å. Accordingly, the native oxide does not affect the electrical connection between the substrate and a silicide plug to be later formed.

In other words, a thin native oxide film having a thickness less than 70Å is formed on the surface of the silicon substrate corresponding to the bottom of the contact hole. This film does not affect the electrical connection between the substrate and the silicide plug. It also is formed naturally when the surface of the substrate is exposed to air without using another process step. At that time, since the negative value of energy ($\Delta H°$ F.) for oxide formation in platinum is very low compared with other metals, the platinum is not almost oxidized. In other words, when polysilicon reacts with platinum by annealing to form silicide, the platinum does not react with the native oxide ($SiO_2$). The native oxide prevents the platinum from being converted to silicide. Therefore, the silicide reaction can be self-controlled by the native oxide. Also, since the platinum is not recessed into the silicon substrate due to the native oxide, encroachment of the substrate can be prevented. Additionally, since silicon from the substrate does not permeate into the platinum due to the native oxide, spiking is prevented.

Figure 6D:
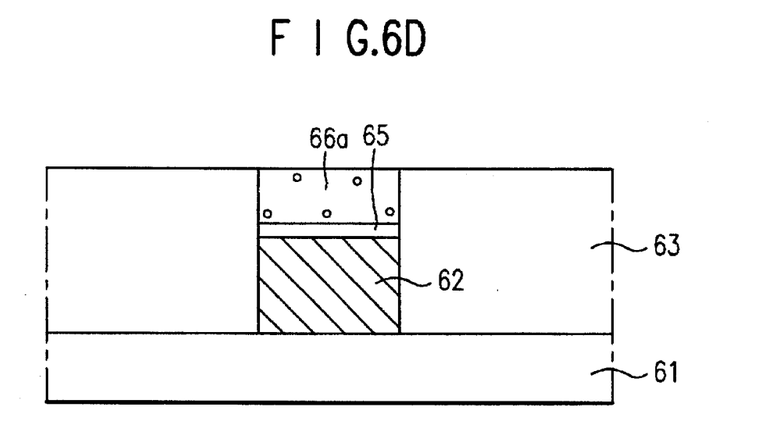
Figure 6E:
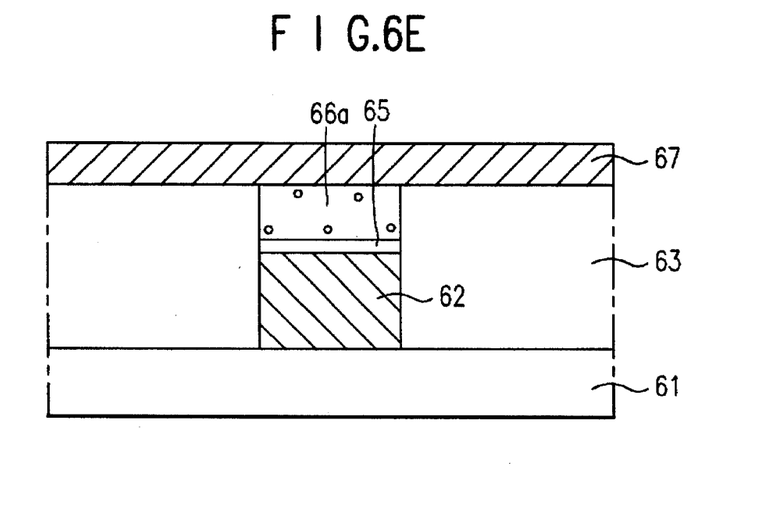

Next, the blanket polysilicon film 66 is subjected to an etch back process so as to expose the surface of the insulating film 63, thereby forming a silicon plug 66a in the contact hole, as shown in FIG. 6D. Subsequently, using a sputtering process, a thin platinum film 67 is deposited on the entire resulting structure, as shown in FIG. 6E.

Figure 6F:
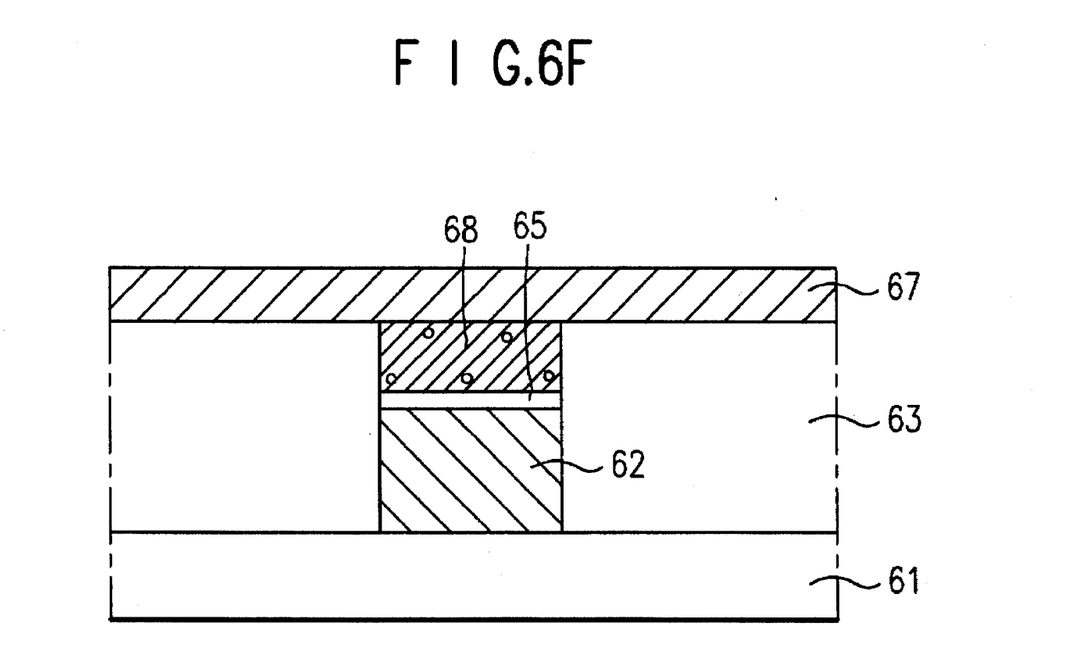

Thereafter, a heat treatment is carried out at temperatures ranging from approximately 250° C. to approximately 350° C., to transform the silicon plug 66a to a platinum silicide 68, as shown in FIG. 6F. At this time, an ambient gas is selected from among nitrogen gas, argon gas and forming gas ($N_2/H_2$).

Therefore the silicide reaction can be self-controlled by the native oxide 65. At that time, since the negative value of energy ($\Delta H°$ F.) for oxide formation in platinum is very low, the platinum film 67 is not almost oxidized. In other words, when the polysilicon film 66 reacts with the platinum film 67 by annealing to form the platinum silicide 68, the platinum does not then react with the native oxide 65 since the native oxide prevents the platinum from being converted to platinum silicide.

Figure 6G:
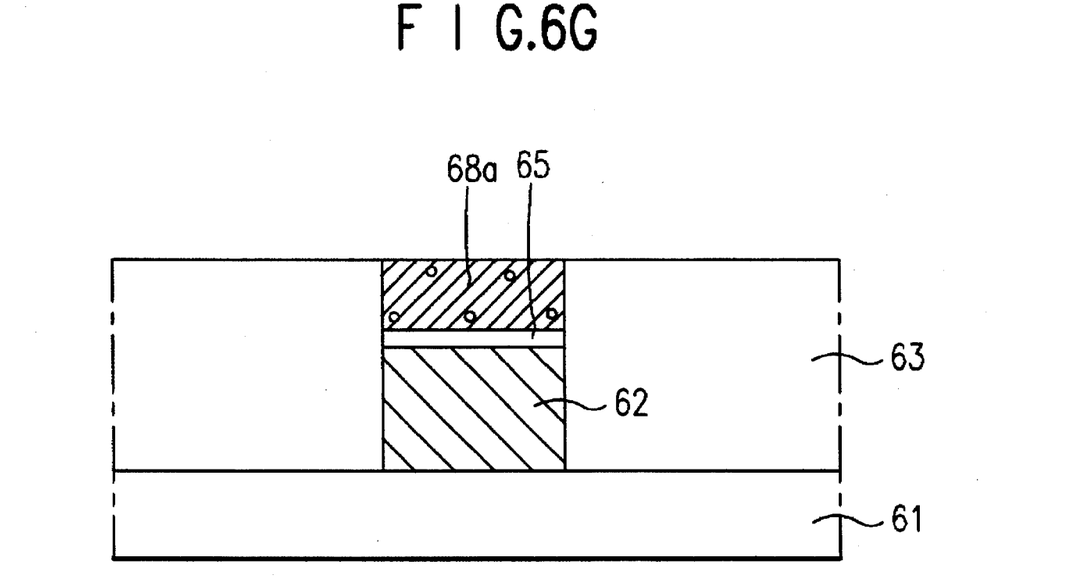

Finally, using aqua regia, non-reacted platinum 67 is removed, so as to form a silicide plug 68a on the native oxide 65, as shown in FIG. 6G.

As described hereinbefore, the present invention has the following advantages.

First, since the temperature of formation for silicide is lower compared to the conventional method, since this is better because formation processes are performed after the formation of a source/drain junction or a lower wiring of a multi-wiring. While the temperature of formation for conventional nickel silicide is 600° C., the temperature for forming the inventive platinum silicide 68 is 300° C. Hence, in the present invention, the silicide plug 68a can be formed at temperatures that are at least 300° C. lower than that of the conventional method. Therefore, the conventional silicide formation method cannot be applied to a multi-wiring arrangement, while the present method can. In addition, the device produced according to the present invention has improved stability compare to that produced by the conventional processes, due to the lower temperature.

Second, since the melting point (1,230° C.) of the inventive platinum silicide (PtSi) is higher than that (1,165° C.) of the conventional nickel silicide ($Ni_3Si$), the device produced according to the present invention is superior to the conventional ones in EM characteristics.

Third, since the specific resistance of PtSi is on the order of approximately twenty-eight to approximately forty $\mu\Omega$·cm, which is only half of that of $Ni_3Si$, eighty-two $\mu\Omega$·cm, the parasitic resistance of the PtSi plug is reduced more than that of the $Ni_3Si$ plug, and its electrical characteristics are improved.

Fourth, comparing the energy of formation for metal oxides, the energy of formation for platinum is much smaller than that for nickel. As a result the heat treatment process for the formation of platinum silicide is stably carried out, as compared with the formation of nickel silicide. That is, as contaminants such as oxygen atoms function as a layer discriminating the interface of Pt/PtSi on heat treatment, they are advantageous in carrying out the processes.

Finally, since the composition ratio of platinum to silicon is 1:1 whereas that of nickel to silicon is 3:1, the consumption amount of platinum is not large, as compared with Ni in the conventional method. Therefore, the small consumption of expensive Pt is advantageous over the large consumption of Ni, thereby reducing costs.

While the present invention has been described with reference to certain preferred embodiments and examples, it will be appreciated by those skilled in the art that numerous variations and modifications are possible without departing from the spirit or scope of the invention as broadly described.

What is claimed is:

1. A method for forming a platinum silicide plug, the method comprising the steps of:

(a) providing a silicon substrate having a conductive layer on a portion of the silicon substrate;

(b) forming an insulating layer on the silicon substrate and the conductive layer;

(c) patterning the insulating layer to form a contact hole on the conductive layer;

(d) exposing the conductive layer to air and thereby forming a native oxide film on the conductive layer;

(e) forming a polysilicon film on the native oxide film and the insulating layer so as to completely fill the contact hole;

(f) etching back the polysilicon film to expose the insulating layer, thereby forming a silicon plug in the contact hole;

(g) forming a platinum layer on the silicon plug and the insulating layer;

(h) performing heat treatment to convert the silicon plug to a platinum silicide plug; and (i) removing the platinum layer remaining on the platinum silicide plug and the insulating layer.

2. A method according to claim 1 wherein the thickness of the native oxide film is under 70 Å.

3. A method according to claim 1 wherein the silicon substrate includes a source/drain region.

4. A method according to claim 1, wherein the insulating layer is an oxide film.

5. A method according to claim 1 wherein the polysilicon film is deposited at temperatures of not less than 600° C. using a chemical vapor deposition process.

6. A method according to claim 1, wherein the polysilicon film is an amorphous polysilicon film.

7. A method accordingly to claim 6 wherein the amorphous polysilicon film is deposited at temperatures of approximately 500° C. using a chemical vapor deposition process.

8. A method according to claim 1, wherein said heat treatment step is carried out at temperatures ranging from approximately 250° to approximately 350° C.

9. A method according to claim 1, wherein said heat treatment step is carried out under an ambient gas selected from the group consisting of nitrogen gas, argon gas and a gas mixture of $N_2$ and $H_2$.

10. A method according to claim 1 wherein the silicon substrate comprises a refractory silicide wiring film.

11. A method according to claim 1 wherein the silicon substrate comprises a refractory capped aluminum wiring film.

12. A method according to claim 1, wherein the silicon substrate comprises a gate having a polycide wiring film.

13. A method according to claim 10, wherein the refractor silicide wiring film includes tungsten silicide.

14. A method according to claim 1, wherein the platinum layer is removed using aqua regia.

* * * * *